United States Patent [19]

Wang et al.

[11] Patent Number: 4,754,434
[45] Date of Patent: Jun. 28, 1988

[54] SWITCHING PLANE REDUNDANCY

[75] Inventors: Moon-Yee Wang; James Yu; Hong-Gee Fang, all of San Jose, Calif.

[73] Assignee: Advanced Micro Devices, Inc., Sunnyvale, Calif.

[21] Appl. No.: 770,815

[22] Filed: Aug. 28, 1985

[51] Int. Cl.$^4$ .............................................. G11C 7/00
[52] U.S. Cl. .................................................. 365/200
[58] Field of Search ........................... 365/200; 371/10

[56] References Cited

U.S. PATENT DOCUMENTS

| 4,473,895 | 9/1984 | Tatematsu | 365/200 |
| 4,535,259 | 8/1985 | Smarandon | 365/200 |
| 4,599,709 | 7/1986 | Clemons | 365/189 |

Primary Examiner—James W. Moffitt
Attorney, Agent, or Firm—Patrick T. King; Warren M. Becker

[57] ABSTRACT

A memory comprising apparatus for selecting redundant rows of memory cells wherein the addressing of a defective regular row of memory cells coupled to a first set of bit lines results in the selection of a redundant row of memory cells coupled to a second set of bit lines such that signal interference resulting from the simultaneous enablement of two word lines in the memory is avoided.

6 Claims, 3 Drawing Sheets

SWITCHING PLANE REDUNDANCY

BACKGROUND OF THE INVENTION

1. Field of the Invention

The present invention relates to apparatus for addressing rows of memory cells in general and to a memory device comprising an apparatus for selectively addressing redundant rows of memory cells in particular.

2. Description of Prior Art

A digital memory of the type to which the present invention relates comprises a plurality of rows and columns of memory cells which are fabricated on a solid-state chip. Typically, the contents of the cells in each row comprise a data word.

In a typical embodiment of such a memory, the rows of cells are functionally divided between a first and a second set of cells. For example, in a memory comprising 32 rows of cells for storing 32 data words, 16 rows are located in the first set of cells and 16 rows are located in the second set of cells. To address a particular row in either set, a five bit address $A_0$-$A_4$ is used wherein the most significant bit $A_4$ defines the set in which the row is located. For example, if the rows in each set are stacked in a numerically ascending order with the lowest order row at the top of each stack, the fifth row from the top of the stack in the first set would have the $A_0$-$A_4$ address 10100, whereas the same row in the second stack would have the $A_0$-$A_4$ address 10101.

As memory densities increased, it became economically impractical to discard a memory simply because one or more cells in one or more rows was defective.

One of the techniques used to avoid discarding a memory because of the existence of one or more defective rows of cells in the memory was to include in the fabrication of the memory on each chip a plurality of regular rows of memory cells and one or more redundant rows of cells which could be used in place of a defective regular row.

In the development of a memory using the latter technique, commonly called direct fusing, a fuse was provided in each of the regular rows of memory cells. After fabrication and testing of the memory, if a regular row in the memory was found to contain a defective cell, the fuse associated with that row was blown, disabling the row, and one of the redundant rows was enabled to respond to the address of the defective regular row. The apparatus used for enabling the redundant row to respond to the address of a defective regular row was called a redundant row decoder.

As the need for even higher memory densities developed, the space required to use fuses for disabling defective regular rows in a memory became impractical and another technique for disabling defective regular rows and addressing redundant rows was developed. This technique is commonly called indirect fusing.

In the implementation of the conventional indirect fusing technique there was provided on a solid-state chip a plurality of regular rows of memory cells and one or more redundant rows of memory cells, a regular row decoder and a redundant row decoder. The regular rows and the redundant rows used for replacing a defective regular row were coupled to the same bit lines.

After fabrication and, if in testing, a regular row in a memory using the conventional indirect fusing technique was found defective, the redundant row decoder was enabled to respond to the address of the defective regular row, as by the blowing of selected fuses provided therein for that purpose.

In the operation of a memory embodying the indirect fusing technique, when the address of a defective regular row was applied to the memory, the redundant row decoder, which was enabled to respond to the address of the defective regular row, would respond to the address and at the same time provide a disabling signal for disabling the regular row decoder used for addressing all of the regular rows.

While eliminating the need for fuses in each of the regular rows and thereby conserving space on the chip, it was found that in practice, the time required for disabling the regular row decoder in a memory using the conventional indirect fusing technique was relatively long such that, for at least a brief period of time, the defective regular row and a redundant row which had been enabled to respond to the address of the defective regular row would both produce signals on the bit lines to which they were coupled in parallel when the defective regular row was addressed. When this occurred and there was inconsistent data in corresponding cells in the defective regular row and the redundant row, e.g. a logical 1 in one of the rows and a logical 0 in the other, erroneous or unreadable data signals could appear on the bit lines to which the redundant and regular rows were coupled.

SUMMARY OF THE INVENTION

In view of the foregoing, a principal object of the present invention is a memory embodying an indirect fusing technique comprising an apparatus for addressing a redundant row of memory cells coupled to a second set of bit lines in response to an address of a regular row of memory cells coupled to a first set of bit lines, an apparatus for disabling a decoding apparatus used for addressing said regular rows and an apparatus for passing data between said second set of bit lines and a set of data output lines while blocking all signals generated on said first set of bit lines when said redundant row is being addressed.

More specifically, there is provided in accordance with the above object a memory comprising a first set of regular rows of memory cells and a first set of redundant rows of memory cells coupled to a first set of bit lines, a second set of regular rows of memory cells and a second set of redundant rows of memory cells coupled to a second set of bit lines, regular row decoding apparatus for decoding the addresses of said regular rows of memory cells, redundant row decoding apparatus for decoding the address of a redundant row coupled to one of said sets of bit lines in response to the address of a regular row coupled to the other of said sets of bit lines, said decoding apparatus including apparatus for disabling said regular row decoding apparatus when a redundant row is being addressed, and an apparatus responsive to said decoding apparatus for passing data between said one set of bit lines to which the redundant row is coupled and a set of data output lines.

BRIEF DESCRIPTION OF THE DRAWING

The above and other objects, features and advantages of the present invention will become apparent from the following detailed description of the accompanying drawing in which.

DETAILED DESCRIPTION OF THE DRAWING

Figure 1:
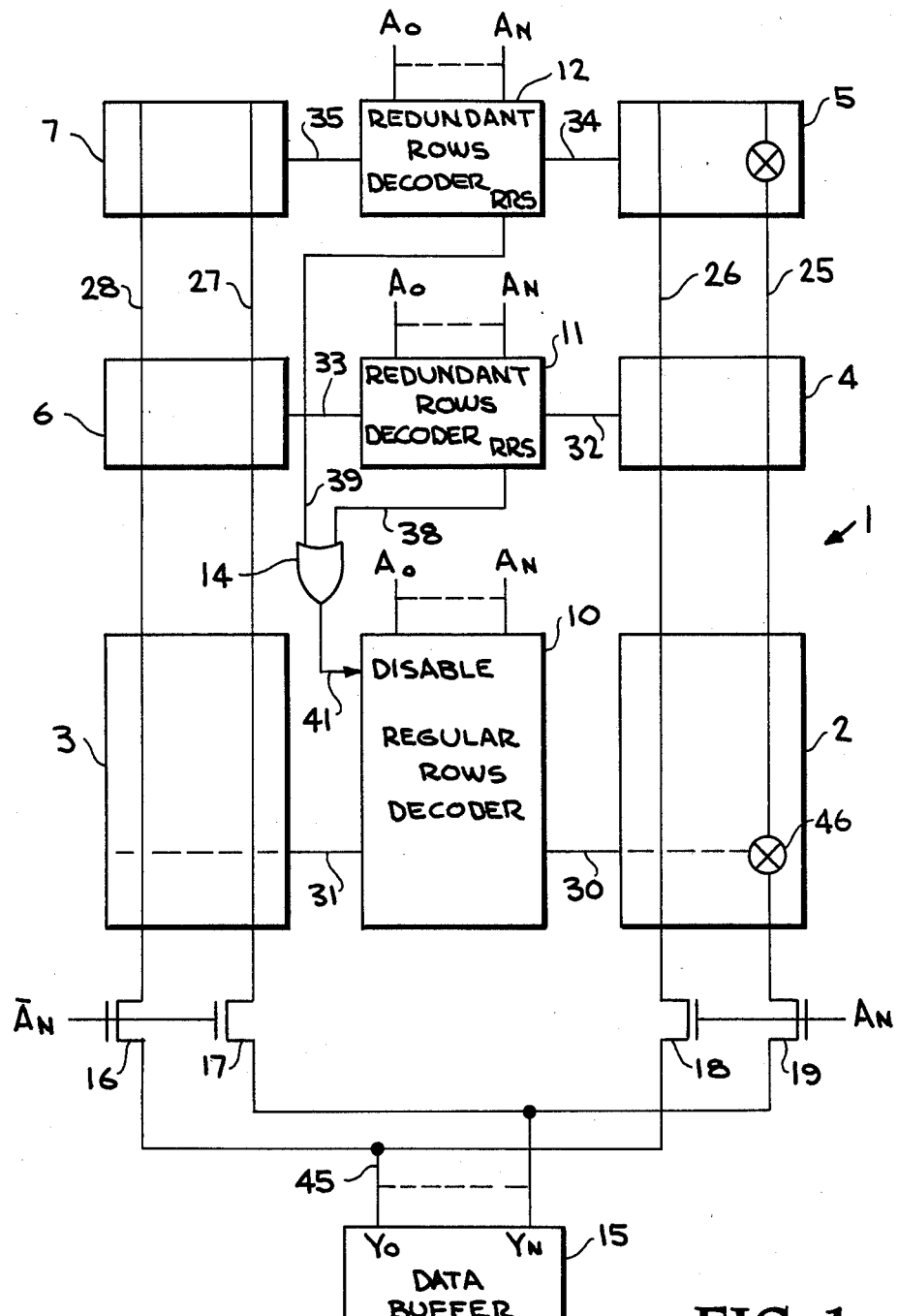
FIG. 1 is a block diagram of a prior known memory embodying an indirect fusing technique comprising an apparatus for selectively addressing redundant rows of memory cells.

Referring to FIG. 1, there is shown a prior known memory apparatus designated generally as 1. In the apparatus 1 there is provided a plurality of regular rows of memory cells which are equally divided between a first set 2 and a second set 3, a plurality of redundant rows of memory cells 4, 5, 6 and 7, a regular rows decoder 10, a plurality of redundant rows decoders 11 and 12, an OR gate 14, a data buffer 15 and a plurality of pass gates 16, 17, 18 and 19.

Corresponding cells in each of the regular rows of memory cells in the first set 2 and in the redundant rows 4 and 5 are coupled in parallel to a plurality of pairs of bit lines as represented by the vertical lines 25 and 26. Similarly, corresponding cells in each of the regular rows of memory cells in the second set 3 and in redundant rows 6 and 7 are coupled in parallel to a plurality of pairs of bit lines as represented by vertical lines 27 and 28. An additional pair of bit lines (not shown) is provided for each additional cell in a row. For example, a typical memory may comprise a plurality of eight cell rows for storing a plurality of 8-bit data words. In such a case, eight pairs of bit lines are provided for coupling to the cells in each row.

Pass gates 16, 17, 18 and 19 are coupled to bit lines 28, 27, 26 and 25, respectively, for passing data between those bit lines and the data buffer 15 when the pass gates are enabled, as will be further described below.

Once again, while only four pass gates are shown, it will be understood that a pass gate is provided for each of the bit lines in the memory and that a corresponding number of input lines to the data buffer 15 is also provided. Similarly the regular rows decoder 10, while shown as having only two word lines designated 30 and 31 for accessing the rows to which they are coupled in the first and second sets 2, 3, is provided with a word line for each of the rows in the sets 2 and 3.

In addition to the word lines 30, 31, there is provided in the regular rows decoder 10 a plurality of inputs for receiving an address $A_0$–$A_n$ and a disable signal input.

Extending from the redundant rows decoder 11 there is provided a pair of word lines 32 and 33. Extending from the redundant rows decoder 12 there is provided a pair of word lines 34 and 35. Further, in each of the redundant rows decoders 11-12 there is provided a plurality of inputs for receiving the address $A_0$–$A_n$, and a circuit means for generating a redundant row select signal RRS on one of a plurality of output signal lines 38 and 39 coupled to corresponding inputs of the OR gate 14. The output of the OR gate 14 is coupled to the disable signal input of the regular rows decoder 10 by a line 41.

In practice, the regular rows of memory cells in the first and second sets 2 and 3 and the redundant rows of memory cells in the rows 4–7 are fabricated on a solid-state chip at the same time. After the fabrication process is completed, the memory is tested. If a defective cell is found in one of the regular rows, such as the cell designated 46 coupled to word line 30 in the first set 2, one of the redundant row decoders 11-12 is enabled to respond to the address of the defective regular row. For example, if the regular row coupled to the word line 30 is defective, the redundant rows decoder 12 may be enabled to respond to the address of the row coupled to the word line 30.

Figure 2:
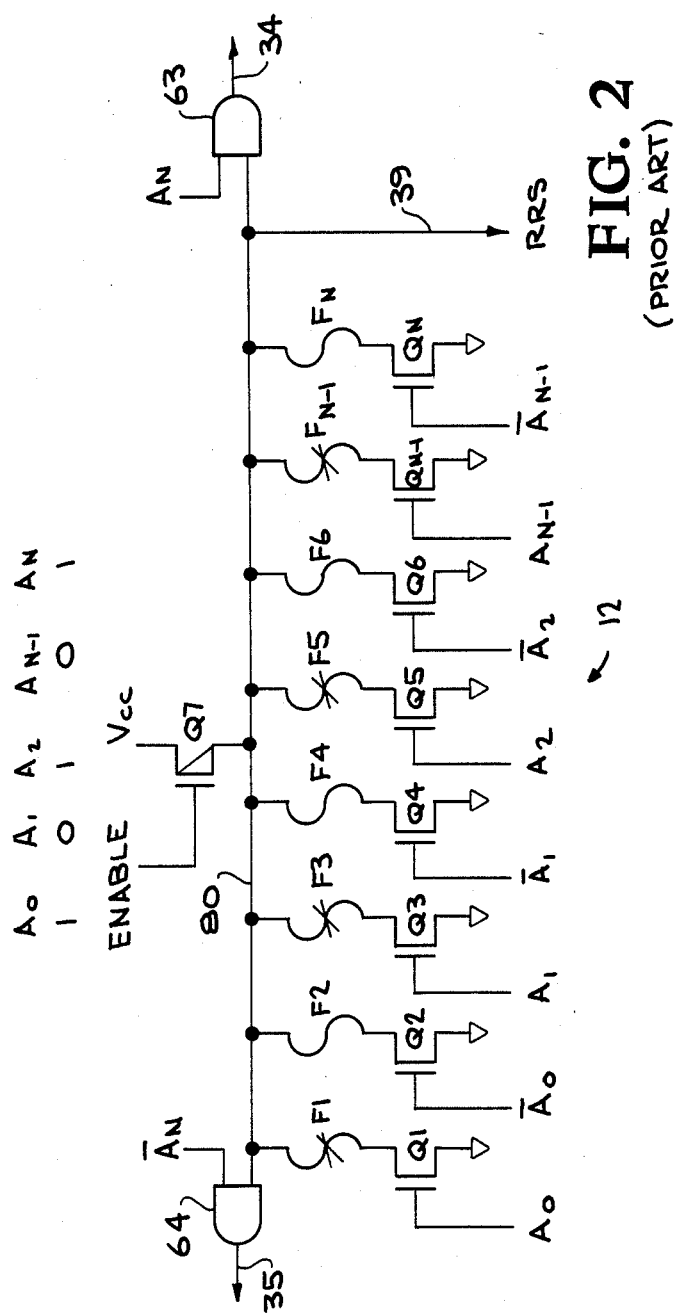
FIG. 2 is a schematic of a prior art redundant row decoder used in the apparatus of FIG. 1.

Referring to FIG. 2, there is provided in the redundant rows decoder 12 a plurality of field effect transistors $Q_1$-$Q_6$... $Q_n$, a plurality of fuses $F_1$-$F_6$... $F_n$, a field effect transistor $Q_7$ and a pair of AND gates 63 and 64.

A first input of the AND gates 63 and 64 are coupled to a line 80. The transistors $Q_1$-$Q_n$ are coupled to the line 80 by means of the fuses $F_1$-$F_n$. The gates of the transistors $Q_1$-$Q_n$ are provided for receiving address bits $A_0$, $\overline{A_0}$, $A_1$, $\overline{A_1}$, $A_2$, $\overline{A_2}$, $A_{n-1}$, $\overline{A_{n-1}}$, respectively. A second input to the AND gates 63 and 64 is provided for receiving the address bits $A_n$ and $\overline{A_n}$, respectively. The line 39 is coupled to the line 80 for providing a redundant row select signal RRS. The outputs of the AND gates 63 and 64 are coupled to the word lines 34 and 35, respectively. The transistor $Q_7$ is provided for coupling a power supply $V_{CC}$ to the line 80. The gate of transistor $Q_7$ is provided for receiving an enable signal.

The specific manner in which the redundant rows decoder 12 is enabled to respond to the address of a defective regular row will now be described.

Assuming that the address $A_0$–$A_n$ of the defective regular row coupled to word line 30 is 10101, the fuses $F_1$, $F_4$, $F_5$ and $F_n$ are blown disconnecting transistors $Q_1$, $Q_3$, $Q_5$ and $Q_{n-1}$ from the line 80. With transistors $Q_1$, $Q_3$, $Q_5$ and $Q_{n-1}$ disconnected from the line 80, it can be seen that in response to an enable signal applied to the gate of $Q_7$ and the address 10101, the line 80, word line 34 and disable signal line 39 will be driven high, and that for all other addresses, the line 80, word line 34 and disable signal line 39 will be pulled low. This is due to the fact that, for all other addresses, at least one of the transistors $Q_1$-$Q_n$ will be enabled or rendered conductive.

Once a defective regular row has been identified and a redundant row decoder has been enabled to respond to the address of the defective regular row as described above, the memory is placed in normal service.

In normal service, addresses $A_0$–$A_n$ of the regular rows are applied to the regular rows decoder 10 and the redundant rows decoders 11-12. If one of the redundant rows decoders 11-12, such as decoder 12, is enabled to respond to the address of a defective regular row, the word line associated with that redundant row decoder will be enabled. At the same time, a redundant row select signal RRS will be generated by the redundant row decoder involved and that signal will be processed by the OR gate 14 to disable the regular rows decoder 10. For example, if redundant rows decoder 12 is the redundant rows decoder which is enabled to respond to the address of the regular row coupled to word line 30, the redundant rows decoder 12 will enable word line 34 in response to that address as described above. When word line 34 is enabled, the redundant row 5 is enabled to send or receive data on the bit lines coupled to the row, e.g. bit lines 25 and 26. At the same time, the redundant row select signal RRS will be generated on the output line 39 causing the regular rows decoder 10 to be disabled. Also at the same time, the gates of pass gates 18 and 19 will be enabled by the most significant bit $A_n$ of the address which for purposes of the present explanation is a 1 for all rows in set 2 and a 0 for all rows in set 3. With the pass gates 18 and 19 enabled, data from the redundant row 5 is transferred between the bit lines 25, 26 and the data buffer 15.

Figure 3:
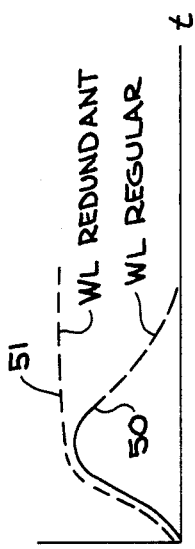
FIG. 3 is a waveform diagram representing the simultaneous generation of two signals on a single bit line in the apparatus of FIG. 1.

Referring to FIG. 3, there is provided a representation of two signals 50 and 51 which are generated as a result of the above-described operation of the apparatus of FIG. 1. As the address of a defective regular row is applied to the regular rows decoder 10 and the redundant rows decoders 11-12, both word line 30 and word line 34 will be enabled. The result of the simultaneous enablement of both word lines 30 and 34 may produce an output on the bit lines attached to the cells coupled to the word lines 30 and 34. As shown in FIG. 3, the solid curve 50 represents the signal which may be produced by the enablement of word line 30 before the decoder 10 is disabled, and the dashed curve 51 represents the signal which may be produced on the same bit line by the enablement of word line 34. It will be appreciated that if the contents in the cells coupled to the bit lines 25 and 26 are inconsistent, i.e. a logical 1 and a logical 0, respectively, an erroneous or unreadable data signal may be generated on the bit lines 25 and 26. This condition exists because the regular rows decoder 10 is not entirely disabled by the signal RRS until after the redundant rows decoder word line 34 is enabled. Of course, a delay circuit of some sort could be used for delaying the enablement of the redundant rows decoder 12 until after the decoder 10 is entirely disabled; however, this would result in an undesirable delay in the operation of the memory.

Figure 4:
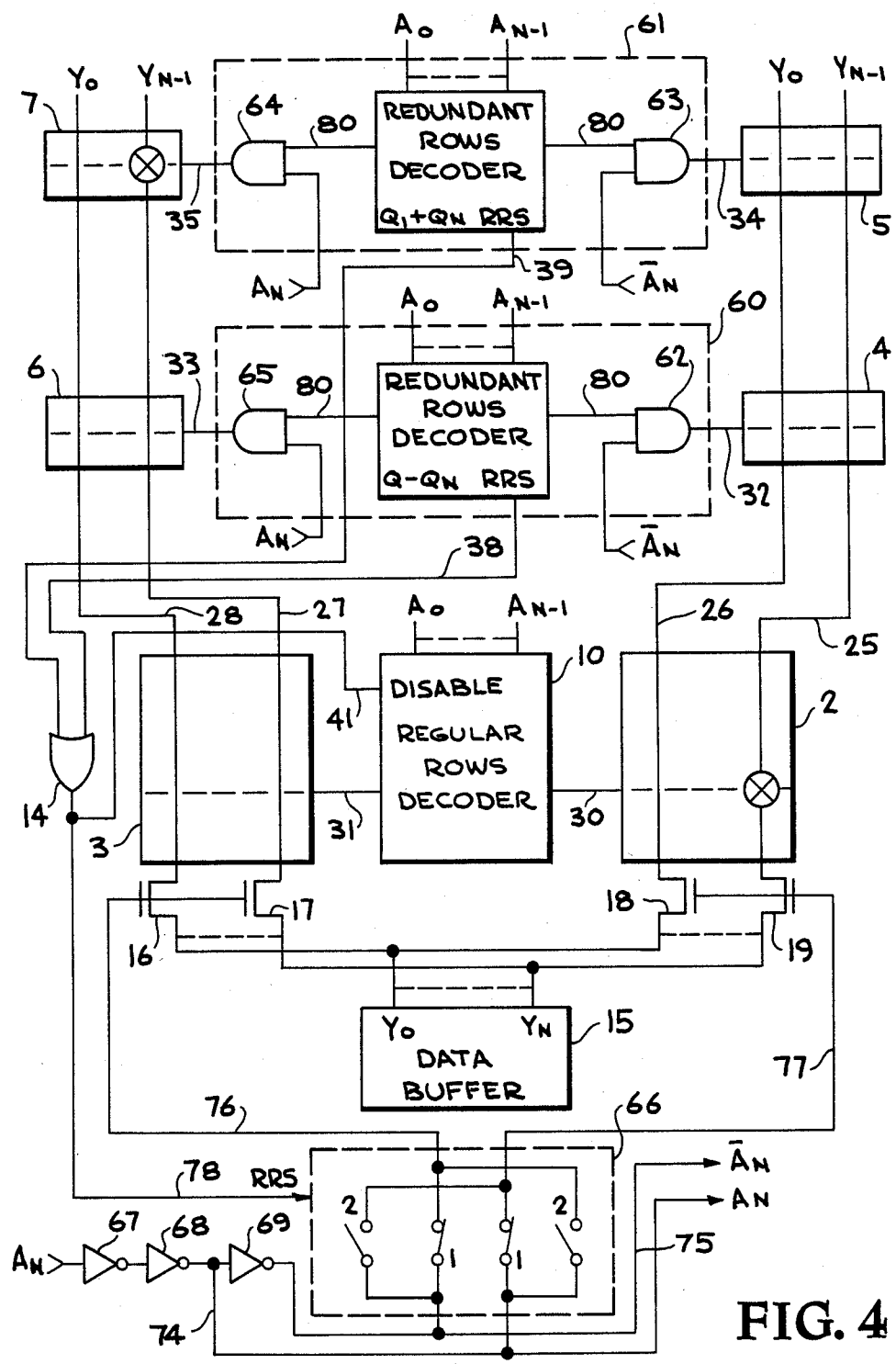
FIG. 4 is a block diagram of a memory comprising an apparatus for selectively addressing redundant rows of memory cells according to the present invention.

Referring to FIG. 4, there is provided in accordance with the present invention a modification of the apparatus of FIGS. 1 and 2 which avoids the above-described problem associated with a simultaneous enablement of two word lines enabling two rows of memory cells coupled to the same bit line. For clarity and ease of understanding, all components of the apparatus of FIG. 4 which are identical to the apparatus of FIG. 1 will be identified using the same numbers used in FIG. 1.

In the apparatus of FIG. 4, there is provided, in addition to circuits described above with respect to FIG. 1, a pair of redundant row decoders 60 and 61 which are responsive to address bits $A_0$-$A_n$, a plurality of AND gates 62, 63, 64 and 65, a pass gate switching circuit 66 and three series-coupled inverters 67, 68 and 69. The decoders 60 and 61 are identical to the decoders 11 and 12 of the apparatus of FIGS. 1 and 2 except that the most significant address bits $A_n$ and $\overline{A}_n$ applied to the second inputs of the AND gates 63, 64 and AND gates 62, 65 are switched from that shown in FIG. 2. Consequently, in the AND gate 62 there is provided a first input which is enabled by a signal on the line 80 and a second input for receiving the complement $\overline{A}_n$ of the most significant address bit $A_n$. In the AND gate 63 there is provided an input coupled to the line 80 and a second input for receiving the complement $\overline{A}_n$ of the most significant address bit $A_n$. In the AND gate 64 there is provided a first input coupled to the line 80 and a second input for receiving the most significant address bit $A_n$. In the AND gate 65 there is provided a first input coupled to the line 80 and a second input for receiving the most significant address bit $A_n$.

The most significant address bit $A_n$ of an address applied to the memory of FIG. 4 is also applied to the inverters 67, 68 and 69 for providing on a line 74 a signal corresponding to the most significant address bit $A_n$ and on a line 75 a signal corresponding to the complement $\overline{A}_n$ of the most significant address bit $A_n$.

In the switching circuit 66 there is provided a pair of poles designated 1 and a pair of poles designated 2 which are coupled to lines 74 and 75. The contact associated with the pole 1 and the contact associated with the pole 2 coupled to the line 74 is coupled to the gates of pass gates 16 and 17 by a line 76. The contact associated with pole 1 and the contact associated with pole 2 coupled to the line 75 is coupled to the gates of the pass gates 18 and 19 by a line 77. The poles 1 and 2 are controlled by the redundant row select signal RRS provided on a line 78 coupled to the output of the OR gate 14.

In operation, an address $A_0$-$A_n$, wherein $A_n$ is the most significant address bit, is applied to the regular rows decoder 10. If $A_n$ is a 1, a row in set 2 of the memory cells is addressed. If $A_n$ is a 0, the rows in set 3 are addressed. For example, if the address $A_0$-$A_n$ is such that word line 30 is enabled, the most significant bit $A_n$ is a logical 1. With $A_n$ being a logical 1, the complement of $A_n$, i.e. $\overline{A}_n$, is a logical 0. If the word line 30 is not coupled to a defective regular row, no redundant row decoder will be enabled to respond to the address and no redundant row select signal RRS will be generated on the line 78 coupled to the poles of the switch 66. Without a redundant row decoder enabled to respond to the address, the redundant row select signal will be low and the poles 1 of switch 66 will couple line 74 to the transfer gates 18 and 19 and the line 75 to the transfer gates 16 and 17. With $A_n$ high and $\overline{A}_n$ low, transfer gates 18 and 19 are enabled permitting a transfer of data between the bit lines 25, 26 of the first set 2 of memory cells and the data buffer 15.

On the other hand, if the regular row coupled to word line 30 comprises a defective cell and a redundant row decoder, such as redundant row decoder 61, is enabled to respond to the address thereof as described above with respect to the apparatus of FIG. 2, the most significant bit $A_n$ and the signal of the redundant row decoder 61 generated on the line 80 will enable redundant row 7 coupled to bit lines 27 and 28 and will generate a redundant row select signal RSS on the line 78 coupled to the poles of the switch 66, causing the poles 1 of switch 66 to open and the poles 2 of switch 66 to close. With the poles 2 of the switch 66 closed, the most significant bit $A_n$ is applied to the transfer gates 16 and 17 and the complementary bit $\overline{A}_n$ is applied to the gates of the transfer gates 18 and 19 thereby enabling the transfer gates 16 and 17 and disabling the transfer gates 18 and 19. With the transfer gates 16 and 17 enabled, bit lines 27 and 28 coupled to the redundant row 7 are coupled to the data buffer 15. At the same time, the redundant row select signal RRS at the output of the OR gate 14 is coupled to the regular rows decoder 10 by the line 41 for disabling the regular rows decoder 10.

From the foregoing, it can be seen that even though a defective regular row and a redundant row are simultaneously selected due to a delay in disabling the regular rows decoder as described above with respect to the apparatus of FIG. 1, data can flow between the data buffer 15 and the redundant row 7 without interference resulting from the simultaneous, albeit transient, enablement of the word line 30.

While a preferred embodiment of the present invention is described above, it is contemplated that various modifications may be made thereto without departing from the spirit and scope of the present invention. For example, while only two redundant row decoders are illustrated, it is apparent that any number of redundant row decoders may be used. Also, while a mechanical type switch 66 is shown in FIG. 4, it is contemplated that the switch 66 will comprise a solid-state switching circuit. Accordingly, it is intended that the embodiment described be considered only as illustrating the present invention and that the scope of the invention be determined by reference to the claims hereinafter provided.

What is claimed is:

1. A memory comprising:
   a first set of regular rows of memory cells coupled to a first set of bit lines;
   a second set of regular rows of memory cells coupled to a second set of bit lines;
   a first redundant row of memory cells coupled to said first set of bit lines;
   a second redundant row of memory cells coupled to said second set of bit lines;
   first means responsive to an address of a regular row having a defective memory cell in said first set of memory cells coupled to said first set of bit lines for addressing said second redundant row of memory cells coupled to said second set of bit lines; and
   second means responsive to an address of a regular row having a defective memory cell in said second set of memory cells coupled to said second set of bit lines for addressing said first redundant row of memory cells coupled to said first set of bit lines.

2. A memory according to claim 1 comprising:
   means for addressing said regular rows of memory cells coupled to said first and said second sets of bit lines in said first and said second sets of memory cells, respectively, and wherein said means for addressing said first and said second redundant rows of memory cells comprises means for disabling said means for addressing said regular rows when either of said redundant rows is being addressed.

3. A memory according to claim 2 comprising:
   a plurality of data lines; and
   means responsive to said redundant row addressing means for transferring data between said plurality of data lines and said first set of bit lines when said first redundant row of memory cells is being addressed and between said plurality of data lines and said second set of bit lines when said second redundant row of memory cells is being addressed.

4. A memory according to claim 3 wherein said data transferring means comprises:
   first and second pass gate means for coupling said plurality of data lines to each of said first and said second sets of bit lines, respectively; and
   switch means responsive to said redundant row addressing means for selectively enabling said first and said second pass gate means.

5. A memory according to claim 4 wherein said redundant row addressing means comprises:
   first means responsive to the most significant bit of an address for addressing said second redundant row coupled to said second set of bit lines when said most significant bit comprises a first predetermined logical level; and
   second means responsive to said most significant bit of said address for addressing said first redundant row coupled to said first set of bit lines when said most significant bit comprises a second predetermined logical level; and
   said switch means comprises:
   first means for enabling said second pass gate means when said most significant bit comprises said first predetermined logical level; and
   second means for enabling said first pass gate means when said most significant bit comprises said second predetermined logical level.

6. A memory comprising:
   a first set of regular rows of memory cells coupled to a first set of bit lines;
   a second set of regular rows of memory cells coupled to a second set of bit lines;
   a first redundant row of memory cells coupled to said first set of bit lines;
   a second redundant row of memory cells coupled to said second set of bit lines;
   a redundant row decoding means responsive to the most significant bit of an address for selectively addressing said second redundant row when said most significant bit comprises a first predetermined logical level and said first redundant row when said most significant bit comprises a second predetermined logical level;
   a plurality of data lines;
   a first and a second set of pass gates coupled between said plurality of data lines and said first and said second sets of bit lines; and
   switch means coupled to a source of said first and said second predetermined logical levels which is responsive to an addressing of either said first or said second redundant row for selectively enabling said first set of pass gates to pass data from said first set of bit lines to said plurality of data lines when said most significant bit comprises said second predetermined logical level and said second set of pass gates to pass data from said second set of bit lines to said plurality of data lines when said most significant bit comprises said first predetermined logical level.

* * * * *